United States Patent
Chi (10) Patent No.: US 6,288,943 B1
(45) Date of Patent: Sep. 11, 2001

(54) METHOD FOR PROGRAMMING AND READING 2-BIT P-CHANNEL ETOX-CELLS WITH NON-CONNECTING HSG ISLANDS AS FLOATING GATE

(75) Inventor: Min-hwa Chi, Hsinchu (TW)

(73) Assignee: Taiwan Semiconductor Manufacturing Corporation, Hsinchu (TW)

( * ) Notice: Subject to any disclaimer, the term of this patent is extended or adjusted under 35 U.S.C. 154(b) by 0 days.

(21) Appl. No.: 09/614,411

(22) Filed: Jul. 12, 2000

(51) Int. Cl.[7] .................................................. G11C 16/04
(52) U.S. Cl. .......................... 365/185.18; 365/185.05; 365/185.28; 365/185.29
(58) Field of Search ..................... 365/185.18, 185.05, 365/185.29, 185.28; 257/318

(56) References Cited

U.S. PATENT DOCUMENTS

| | | | |
|---|---|---|---|
| 4,451,905 | * 5/1984 | Moyer | 365/104 |
| 5,361,235 | * 11/1994 | Kodama | 365/218 |
| 5,487,033 | * 1/1996 | Keeney et al. | 365/185.19 |
| 5,966,329 | * 10/1999 | Ksu et al. | 365/185.18 |
| 6,160,739 | * 12/2000 | Wong | 365/185.29 |

* cited by examiner

Primary Examiner—Son T. Dinh
(74) Attorney, Agent, or Firm—Blakely Sokoloff Taylor & Zafman, LLP (57) ABSTRACT

A method of reading a 2-bit p-channel memory cell having a p+ drain, a p+ source, a control gate, and a floating gate formed from non-connecting hemispherical silicon grain (HSG) islands. The p+ drain and the p+ source is formed in an n-well. The method comprises: applying a positive voltage to the control gate to generate a gate induced drain leakage (GIDL) current; and measuring a drain GIDL current at the drain and a source GIDL current at the source simultaneously to determine the 2-bit data stored in the memory cell.

12 Claims, 9 Drawing Sheets

METHOD FOR PROGRAMMING AND READING 2-BIT P-CHANNEL ETOX-CELLS WITH NON-CONNECTING HSG ISLANDS AS FLOATING GATE

FIELD OF THE INVENTION

The present invention relates to 2-bit p-channel ETOX flash memory, and more particularly, to a method of programming and reading a 2-bit p-channel ETOX flash memory that uses non-connecting hemispherical silicon grain (HSG) islands as the floating gate.

BACKGROUND OF THE INVENTION

The stack-gate ETOX cell, one of the most popular cell structures for flash memories, is widely programmed by channel hot-electron (CHE) and erased by Fowler-Nordheim (FN) tunneling through the source side or the channel area.

Figure 1:
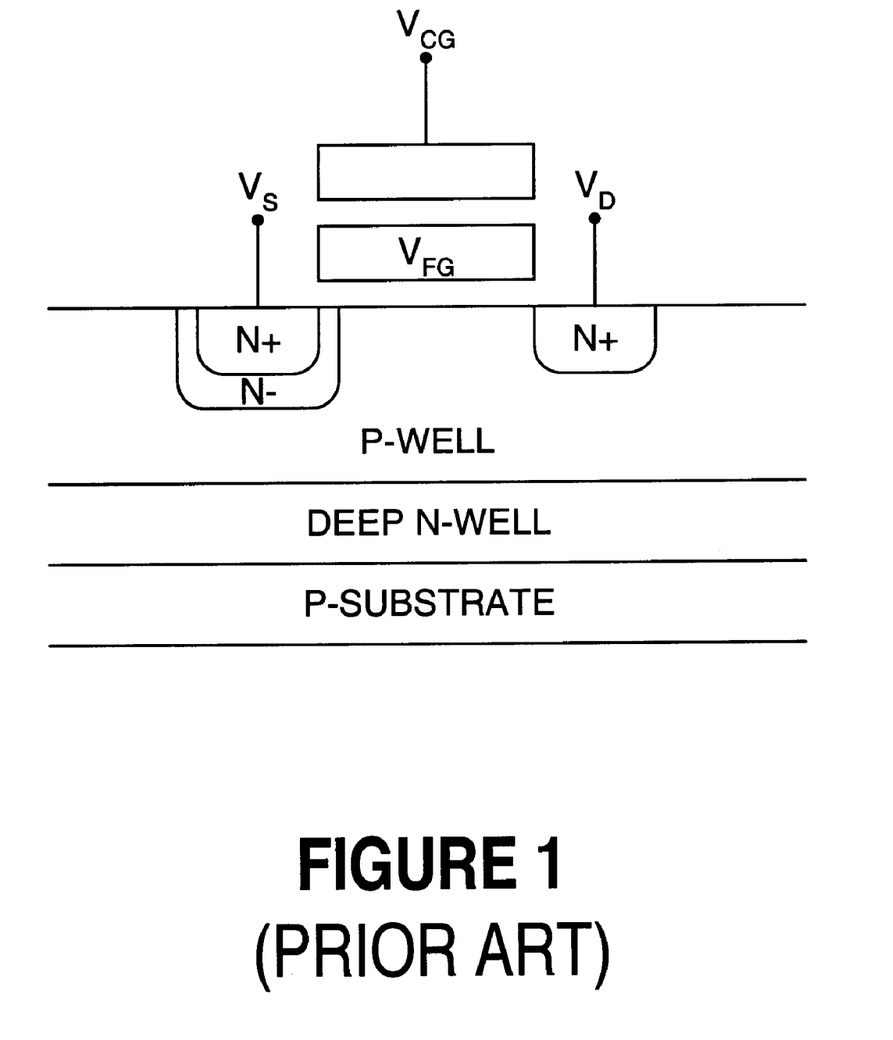
FIG. 1 is a schematic diagram of a prior art ETOX-cell formed by a triple-well process.

The n-channel ETOX cell is conventionally fabricated using a triple-well process, as shown in FIG. 1. The triple-well structure is typically used to protect cells from noises generated outside the deep n-well by reverse-biasing the deep n-well to p-well junction. The n+ source is typically doubly implanted by $As^{75}$ (with a high dose of 3E15/$cm^2$~1E16/$cm^2$ for the n+ junction) and $P^{31}$ (with a lower dose of ~1E14/$cm^2$ for the n-junction) so that the source junction can be biased at high voltage (e.g. ~12 v) during erase operation. The n+ drain is typically implanted by As only with a high dose (~1E16/$cm^2$) and the drain side does not need the lightly-doped-drain (LDD) implant and spacer structure.

The ETOX cell of FIG. 1 is programmed by channel-hot-electrons (CHE). The bias for programming is typically: $V_d$=7 v, $V_{cg}$=9 to 12 v, and $V_s$=0 v. The deep n-well is biased at $V_{cc}$, (i.e. $V_{dnw}$=$V_{cc}$); and the p-substrate is biased at OV (i.e. $V_{sub}$=OV) during all operations. Under these bias conditions, there is a large channel current (~1 mA/cell) for hot electron generation near the channel surface of the drain. Hot electrons are injected into the floating-gate when the oxide energy barrier is overcome and when assisted by the positive control gate bias. After programming, the amount of net electrons on the floating-gate increases, which results in an increase of the cell threshold voltage ($V_T$). The electrons in the floating-gate will remain for a long time (e.g. 10 years at room temperature), unless intentionally erased.

The cell is erased by Fowler-Nordheim (F-N) tunneling through the source side. The bias during source side erase is typically: $V_d$~0 v or floating, $V_{cg}$~-5 v to 0 v, and $V_s$=+9 to +12 v. This establishes a large electrical field (~10 Mv/cm) across the tunnel oxide between the floating-gate and source overlap area. Electrons on the floating-gate will tunnel into the source and be removed away.

The read biases of the prior art ETOX-cell are typically: $V_d$~1 v to 2 v, $V_{cg}$~$V_{cc}$, $V_s$~0 v, $V_{pw}$~0 v, $V_{dnw}$=$V_{cc}$, and $V_{sub}$~0 v. The channel may be inverted or not depending on the net electron charge stored on the floating-gate, and results in the on and off of the cell as measured by the read current $I_{read}$ representing the digital information of "1" or "0" stored in the cell.

One drawback of conventional ETOX cells, as exemplified by FIG. 1, is that the charge on the floating gate may continuously leak away when there are "weak" spots in the tunnel oxide. This is the main limitation that prevents a further decrease in the thickness of the tunnel oxide, which in turn prevents a decrease in the program and erase voltages required. Additionally, the fabrication process for a conventional ETOX cell is more complicated than logic processes, due to the use of high voltage transistors and isolations. Further, the ETOX cell is a single bit memory cell, i.e., only a single bit of data is stored in each ETOX cell.

A prior art multi-bit flash memory cell is exemplified by U.S. Pat. No. 6,011,725 to Eitan. In the '725 patent, a 2-bit cell is formed by replacing the ETOX floating-gate with a charge trapping layer, e.g. nitride or silicon rich oxide (SRO). The charge can be stored locally above the channel near the drain and/or source (referred to as right-bit and left-bit respectively).

The programming of the 2-bits is based on a 2-step procedure using conventional channel-hot-electron (CHE) injection, i.e. CHE programming the drain side (right-bit) by biasing the drain (to 6–7 v) and control-gate (to 10–15 v), then CHE programming the source-side (left-bit) by biasing the source (6–7 v) and control-gate (10–15 v). The read operation is based on a 2-step read, i.e. read the left-bit first by a read bias on the drain (2 v) and control gate (3–5 v), then read the right-bit by biasing the source (2 v) and control gate (3–5 v).

There are several drawbacks of this 2-bit memory cell and its operation. First, the electron trapping layer is still leaky. This is because the charge in the nitride or SRO layer leaks by direct tunneling among traps and/or microscopic silicon islands in the SRO. Note that the SRO is actually oxide with very tiny Si-rich islands (approx. 10 angstroms), which are significantly more conducting than the rest of the oxide. Second, it is difficult to control the trapping density and/or characteristics of the microscopic Si-islands. Third, the 2-step read operation is slow.

In another prior art multi-bit cell, polysilicon spacers are placed on the sides of an n-channel transistor. The oxide underneath the polysilicon spacers is thin and serves as a tunnel oxide for program/erase by F-N tunneling mechanism. The gate oxide is thicker along the channel area. The electron charge is stored in the polysilicon spacers representing 2-bits of digital information. The charge stored in the polysilicon spacer will modify the source/drain resistance measurement relative to a reference resistance. However, this read procedure is slow and complicated.

Figure 2:
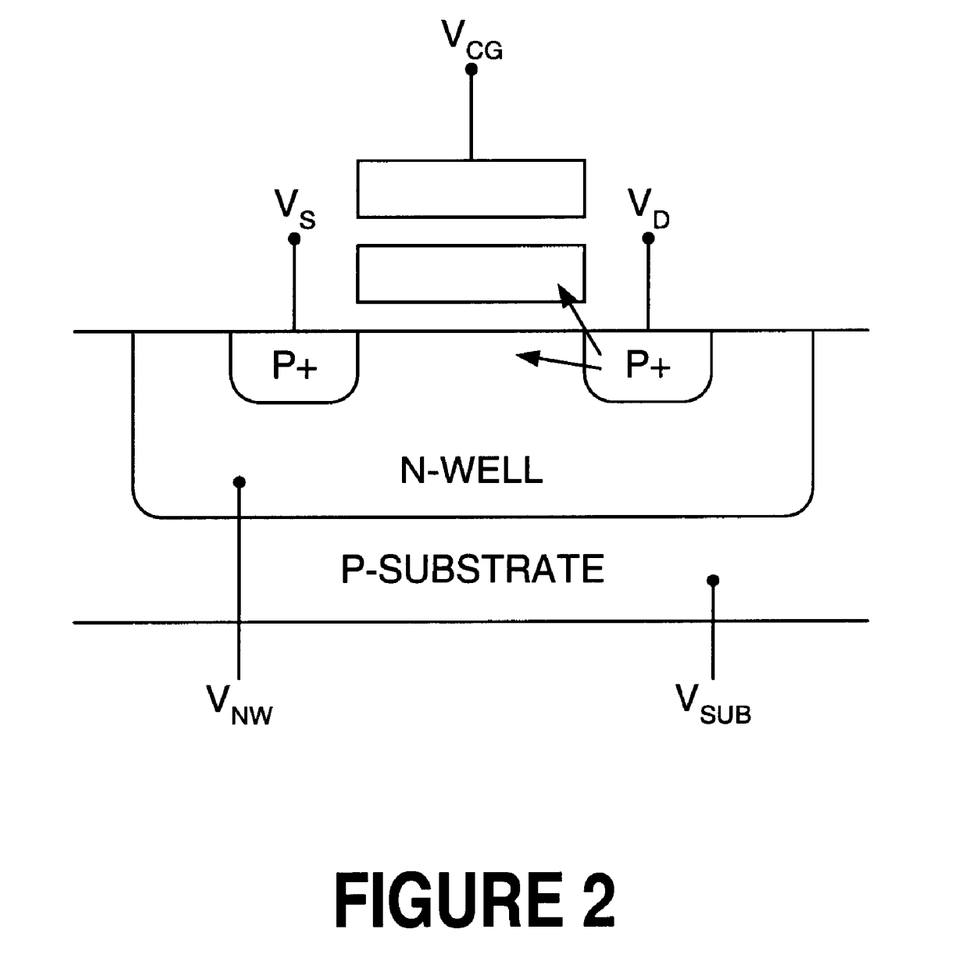
FIG. 2 is a schematic diagram of a prior art p-channel ETOX-cell being programmed using band-to-band tunneling induced hot electron (BBHE) generation.

A conventional p-channel ETOX cell is shown in FIG. 2. Band-to-band tunneling induced hot electron (BBHE) generation and injection has been found useful in programming the cell. See Ohnakado et al., "Novel Electron Injection Method Using Band-to-Band Tunneling Induced Hot Electron (BBHE) for Flash Memory with a P-Channel Cell," Technical Digest of Int'l Electron Devices Meeting, p. 279–282 (1995). With BBHE, only electrons are tunneling through the tunnel oxide instead of holes. This avoids the degradation by hole injection. In operation, $V_s$ is left floating, $V_d$ is biased to $-V_{cc}$, $V_c$ is biased to $V_{cc}$, $V_{sub}$ is at ground, and $V_{nw}$ is biased to $V_{cc}$. This results in electrons initially being generated on the surface of the p+ drain by band-to-band tunneling. These electrons are further accelerated and gain energy through the p+/n-well junction. Hot electrons are generated by the high field at the p+/n-well junction, as well as by impact ionization. These hot electrons overcome the oxide barrier with the help of positive bias from the control gate. The initial electrons on the p+ drain can also be injected to the floating gate directly by Fowler-Nordheim tunneling if the electrical field is large enough across the oxide.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DETAILED DESCRIPTION OF THE PREFERRED EMBODIMENT

Figure 3:
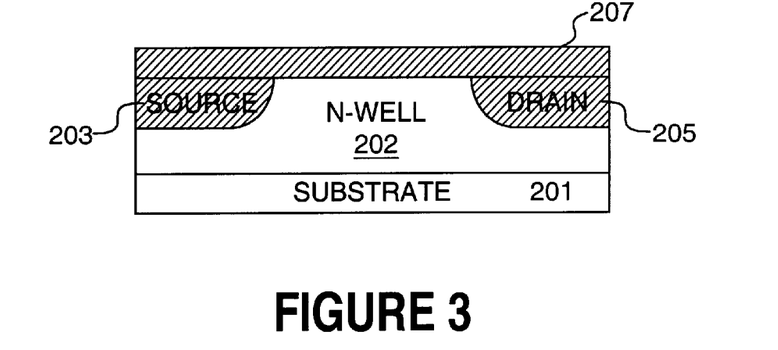
FIGS. 3–14 are cross-sectional views of a method for forming an ETOX cell in accordance with the present invention.

FIGS. 3–14 illustrate the manufacturing process for forming an ETOX cell in accordance with the present invention. Referring to FIG. 3, a silicon substrate 201 is provided. An n-well 202 is formed in the silicon substrate 201. Then, a source 203 and a drain 205 are formed within the n-well. The source 203 and drain 205 are formed using conventional masking and ion implantation techniques. Because a p-channel ETOX cell is being formed, the source 203 and drain 205 are implanted with a P-type dopant to form p+ source 203 and p+ drain 205.

Next, a thin tunnel oxide 207 is formed on top of the silicon substrate 201. Preferably, the tunnel oxide 207 is deposited using a high temperature oxide (HTO) process. Alternatively, the tunnel oxide 207 can be grown using a thermal process, resulting in a "thermal oxide". Preferably, the thickness of the tunnel oxide 207 is approximately 70–90 angstroms, though it may be less.

Figure 4:
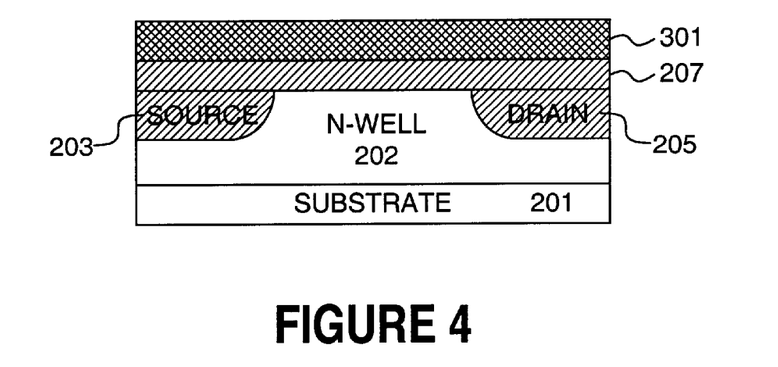
Figure 5:
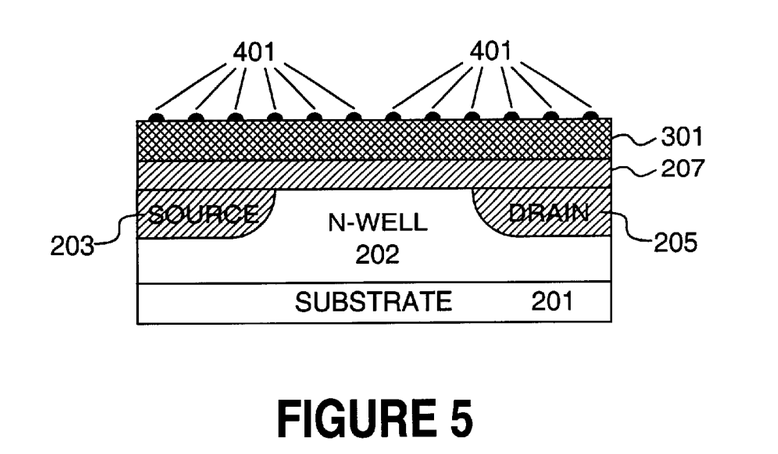

Turning to FIG. 4, after the tunnel oxide 207 is formed, a layer of N-type doped amorphous silicon 301 is deposited. Although it is preferred to use N-type doped amorphous silicon, alternatively, P-type doped amorphous silicon may be used. Preferably, the doped amorphous silicon layer 301 is between 50 to 200 angstroms thick and is deposited at a temperature of less than 530° Celsius. Turning to FIG. 5, silicon nuclei 401 are formed on top of the amorphous silicon layer 301. The silicon nuclei 401 are formed by direct decomposition of $SiH_4$ and $Si_2H_6$ gas. The formation of the silicon nuclei 401 is a conventional step used in the "seeding method" for forming hemispherical grain (HSG) silicon.

Figure 6:
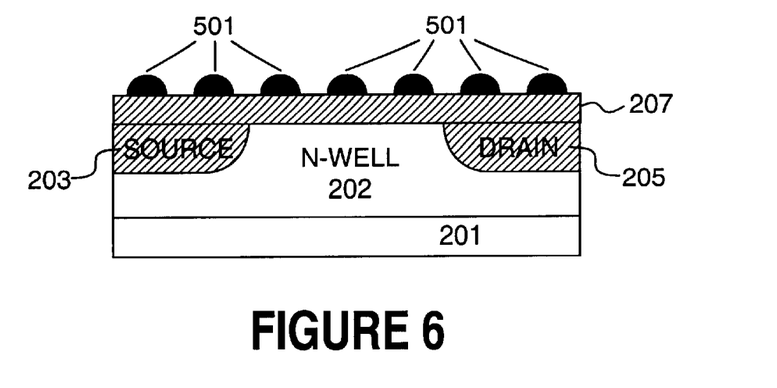

Next, turning to FIG. 6, a thermal annealing step at between 550–580° Celsius is preformed to facilitate growth of HSG silicon grains 501. The growth of HSG silicon grains 501 will consume the doped amorphous layer 301. Preferably, the growth process of the HSG silicon grains 501 is controlled so that the average grain size of the HSG silicon grains 501 is less than 100 angstroms. However, because of difficulty in controlling process variations, the HSG silicon grains 501 in FIG. 6 may be formed with an average grain size of greater than 100 angstroms.

Figure 7:
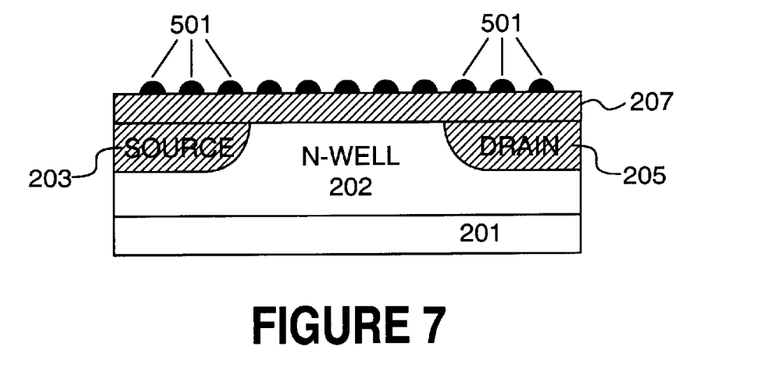

In such a case, then the average size of the HSG silicon grains 501 can be reduced by, for example, a mild wet etch or chemical dry etch until the HSG silicon grains 501 have an average grain size of less than 100 angstroms. It is important to have a relatively small grain size to prevent contact between grains so that charge can be stored on individual grains in the memory device of this invention. Thus, as shown in FIG. 7, after the etching, the HSG silicon grains 501 are made smaller. The etching can be done, for example, by a wet etch solution of $NH_4OH\backslash H_2O_2\backslash H_2O$.

Figure 8:
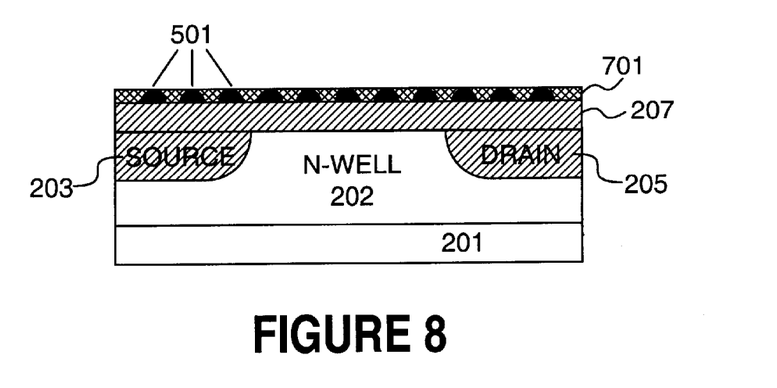
Figure 9:
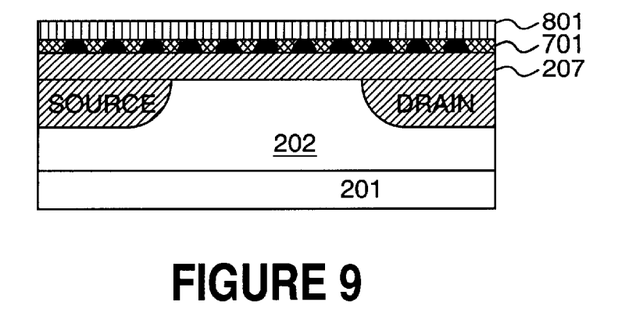

Next, turning to FIG. 8, a first dielectric layer 701 is deposited over the HSG silicon grains 501. Preferably, the first dielectric layer 701 is a high temperature oxide layer having a thickness of less than or equal to 40 angstroms.

In the preferred embodiment, the process of forming HSG silicon grains having an average grain size of 100 angstroms followed by the deposition of a dielectric layer is repeated. This is shown in FIGS. 9–12, which is simply a repeat of the steps in FIGS. 4–8. In other words, a second amorphous doped silicon layer 801 is deposited over the first dielectric layer 701.

Figure 10:
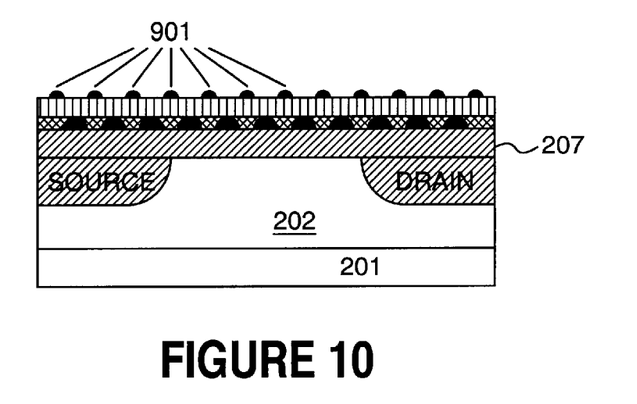
Figure 11:
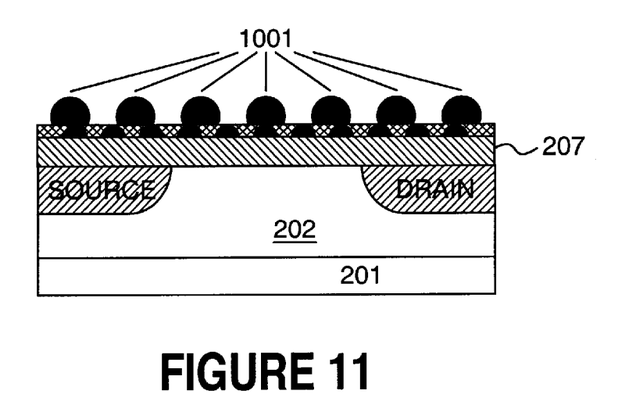
Figure 12:
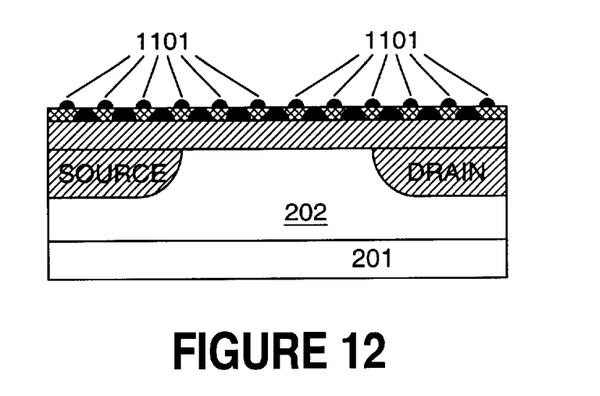

As seen in FIG. 10, silicon nuclei 901 are formed on to the second doped amorphous silicon layer 801. Next, as seen in FIG. 11, a second HSG silicon layer 1001 is formed through a thermal annealing process. The grains in the HSG silicon layer 1001 are etched, if necessary, as seen in FIG. 12 by reference numeral 1101, to be less than or equal to 100 angstroms in size.

It should be noted that the deposition of a second HSG silicon layer 1001 is optional. In other words, only a single layer of HSG silicon is necessary to implement the present invention. Conversely, multiple layers can be stacked on top of each other to increase the charge storage capacity of the ETOX cell.

Where multiple layers are used, it has been found that HSG silicon grains will not grow on top of underlying layers of HSG silicon where there is an overlap. In this case, the number of HSG silicon islands per unit silicon area can be increased for charge storage on the floating gate.

Figure 13:
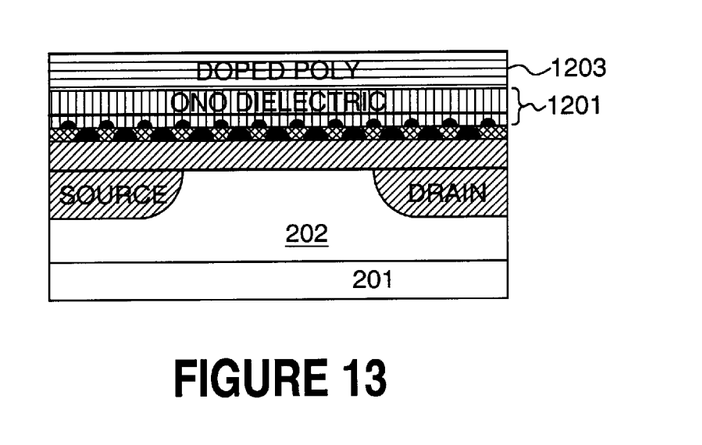

Turning to FIG. 13, a second dielectric layer 1201 is formed over the HSG silicon grains 1101. This serves to completely insulate the HSG grains and make the HSG grains form a floating gate. The second dielectric layer 1201 is preferably a composite of oxide/nitride/oxide. These layers can be deposited using conventional means well known in the prior art. Next, a doped polysilicon layer 1203 is formed on top of the second dielectric layer 1201. The doped polysilicon layer 1203 is deposited using conventional means, for example chemical vapor deposition. Finally, turning to FIG. 14, the multiple layers that have been deposited onto the substrate 201 are patterned and etched to form a stack 1301 between the source 203 and drain 205. The stack 1301 comprises a tunnel oxide 207, a floating gate 1303 comprised of the HSG silicon layers, an insulating stack 1305, and a control gate 1307.

Figure 14:
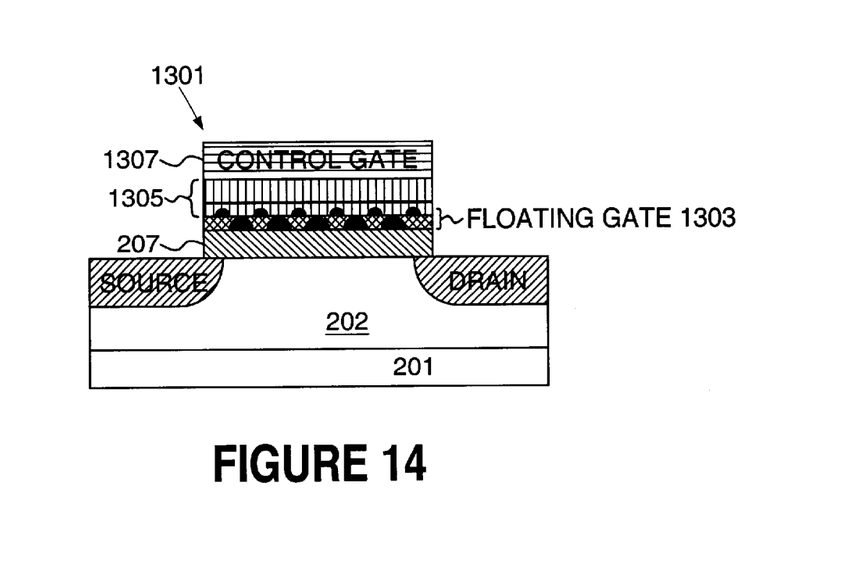

The ETOX cell shown in FIG. 14 has charge stored on the individual HSG silicon grains 501 and 1101. These grains are also referred to herein as HSG islands. Because the HSG islands are spaced apart by approximately 100 angstroms, the direct tunneling of charge among and between the HSG islands is eliminated. The spacing among the HSG islands can be controlled by varying HSG formation process parameters.

While, as in the prior art, the tunnel oxide 207 may have weak points, only those charges that are stored on HSG islands adjacent to the weak spots in the tunnel oxide 207 will be affected. Thus, for maintaining the same performance as prior art ETOX cells, the tunnel oxide 207 may be made thinner, which also results in a lower voltage used for programming and erasing the cell and faster ETOX cell operation.

Perhaps more importantly, because of the structure of the present ETOX cell, a 2-bit cell can be implemented by storing charge locally in HSG islands near the drain 205 or source 203 or both. The operation is described below.

Figure 15:
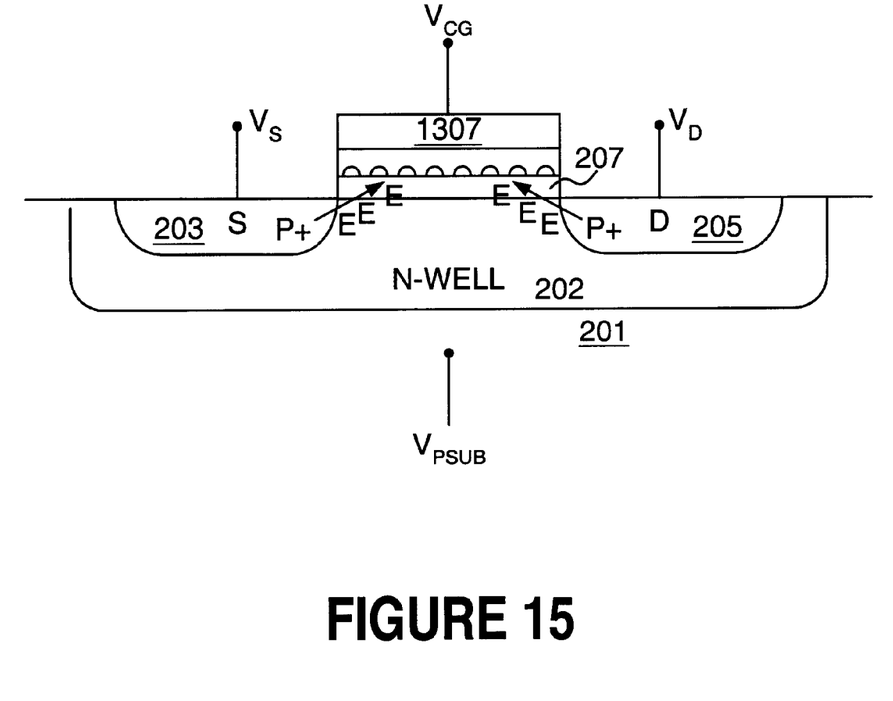
FIG. 15 is a diagram of the ETOX cell of FIG. 14 during a program operation.

Next, turning to FIG. 15, the method of programming the p-channel ETOX cell of FIG. 14 is disclosed. The programming of the 2-bits of the ETOX cell can be done simultaneously. The BBHE injection can be individually or simultaneously triggered near the overlap area of the gate-to-drain or gate-to-source, respectively. This is done by biasing the control gate 1307 voltage $V_{cg}$ to high (e.g. $V_{cc}$ to $2V_{cc}$) and by selectively biasing the drain voltage $V_d$ or source voltage $V_s$ individually to a low voltage (e.g. $-V_{cc}$) as desired.

If the drain voltage $V_d$ is biased to $-V_{cc}$, this results in electrons tunneling into the HSG islands near the drain 205 by the BBHE mechanism. This results in a digital "1" being placed onto the drain side bit of the ETOX cell. Similarly, if the source voltage $V_d$ is biased to $-V_{cc}$, this results in electrons tunneling into the HSG islands near the source 203 by the BBHE mechanism. This results in a digital "1" being placed onto the source side bit of the ETOX cell.

Conversely, if the drain voltage $V_d$ is left at ground or floating, this does not result in electrons tunneling into the HSG islands near the drain 205 by the BBHE mechanism. This results in a digital "0" being placed onto the drain side bit of the ETOX cell. Similarly, if the source voltage $V_s$ is left at ground or floating, this does not result in electrons tunneling into the HSG islands near the source 205 by the BBHE mechanism. This results in a digital "0" being placed onto the source side bit of the ETOX cell.

Note that the designations of digital "1" and digital "0" are arbitrarily defined to be corresponding to charged and non-charged states of the HSG islands, respectively. It can be appreciated that the designations of digital "1" and digital "0" can easily be reversed. Note also that the single step programming technique disclosed herein is faster that the prior art method of using channel hot electron injection to program 2 bits in a cell.

Figure 16:
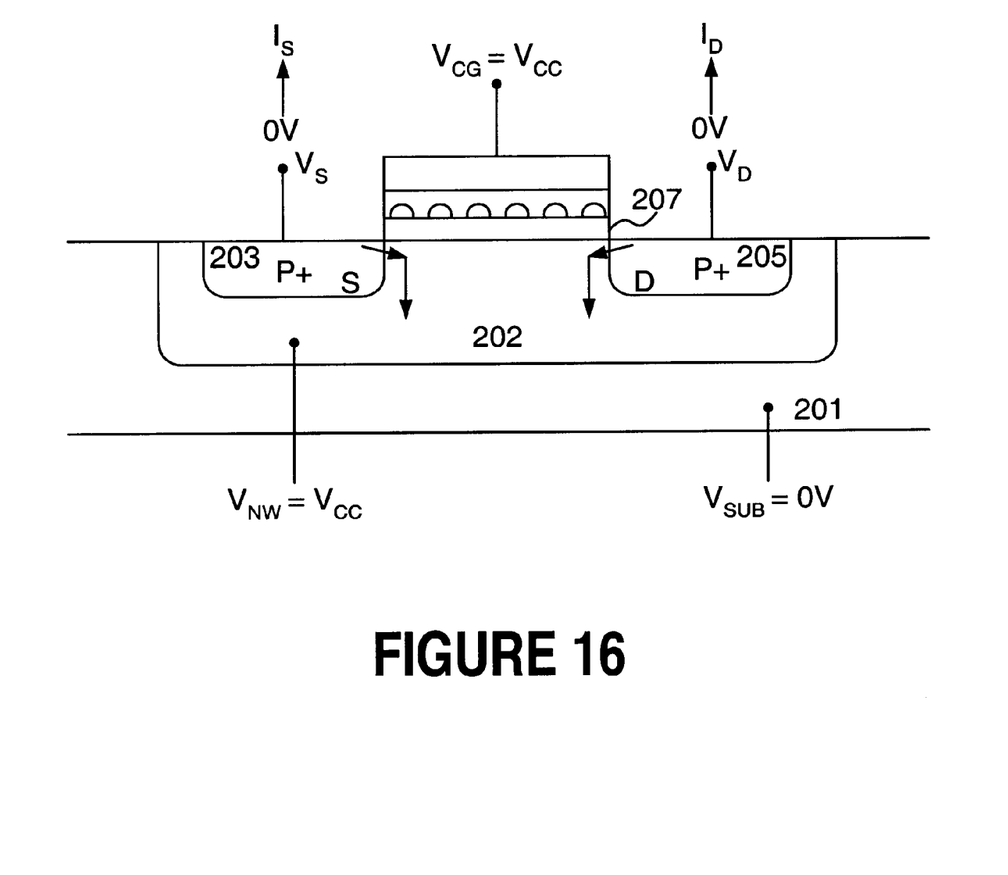
FIG. 16 is a diagram of the ETOX cell of FIG. 14 during a read operation.

Turning to FIG. 16, the read operation of the ETOX cell is illustrated. The read operation is based on the fact that the gate induced drain leakage (GIDL) current at the drain 205 and/or source 203 is strongly (exponentially) dependent on the charge stored in the HSG silicon islands. The GIDL current typically occurs in thin gate oxide MOS devices and is flowing between the drain and/or source and the substrate. The basis of the GIDL current is band-to-band tunneling that occurs on the surface of the gate-to-drain or gate-to-source overlap region. Additional information on GIDL current may be found in "Design for Suppression of Gate-Induced Drain Leakage in LDD MOSFET's Using a Quasi-2-Dimensional Analytical Model," by Parke et al., IEEE Transactions on Electron Devices, Vol. 39, No. 7, July 1992, pp. 694–1702. Since the GIDL current is flowing toward the substrate 201, the GIDL current at the drain 205 and source 203 can be read or measured simultaneously.

As seen in FIG. 16, the preferred bias for the one-step read operation is the following: $V_{cg}$ at $V_{cc}$ (3.3 v); both $V_d$ and $V_s$ at ground (approx. 0 v); $V_{nw}$ at $V_{cc}$ (3.3 v); and $V_{sub}$ at 0 v. When the HSG silicon islands adjacent to the drain 205 (or source 203) in not charged or slightly positively charged (digital "0"), the magnitude of the field between the floating gate and the drain 205 (or source 203) is large enough (>3 Mv/cm) such that a large GIDL current results.

When the cell is programmed (i.e. floating gate charged or digital "1"), the electrical field between the floating gate and the drain is small (<3 Mv/cm), resulting in a small GIDL. The drain (or source) current is therefore strongly modulated by the HSG silicon island charge near the drain (or source) and represents the digital information "1" or "0" stored in the drain side of the cell. By measuring the GIDL current through both the source and the drain, the data stored in the ETOX cell can be determined.

For example, if the GIDL current is above a predetermined threshold, this indicates that no charge is stored in the floating gate adjacent the source or drain, as the case may be. If the GIDL current is below a predetermined threshold magnitude, this indicates that a negative charge is stored in the floating gate adjacent the source or drain, as the case may be.

Moreover, although the read operation has been described in connection with the ETOX-cell shown in FIG. 14, the method of the read operation can easily used with any multi-bit flash memory cell, such as those described in above in the Background of the Invention section.

Figure 17:
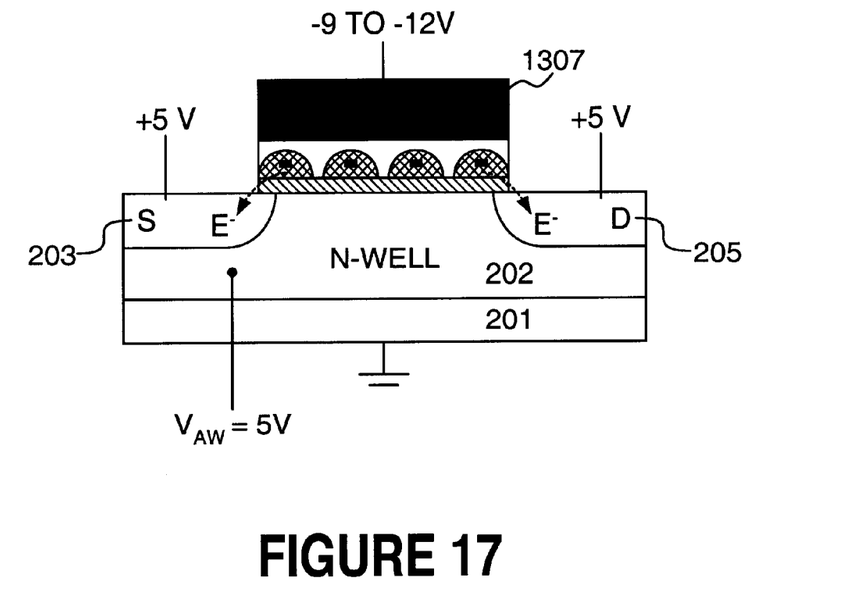
FIGS. 17–18 are diagrams of the ETOX cell of FIG. 14 during an erase operation.

Turning to FIG. 17, the erase operation of the ETOX cell is shown. Note that in FIG. 17, only a single HSG silicon layer is formed as the floating gate 1303. The electrons stored on the HSG silicon islands can be erased (i.e. removed) through the drain 205 and/or source 203 by applying a positive drain/source bias of about 5 volts and a negative control gate 1307 bias of −9 to −12 volts. Also, the n-well voltage $V_{nw}$ is biased to 5 volts. This combination of voltages will drive the electron charge stored on the HSG silicon islands out through the source 203 or drain 205.

Figure 18:
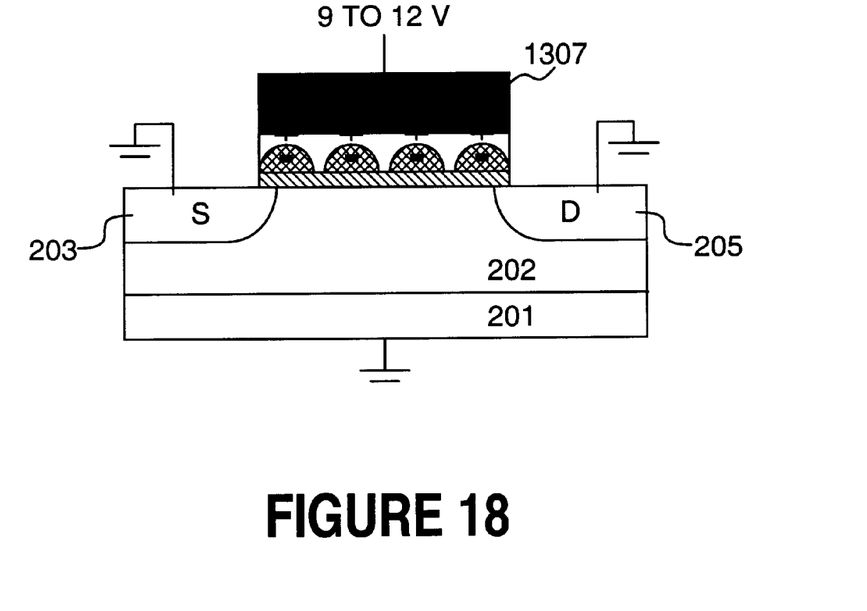

In FIG. 18, an alternate method for erasing the ETOX cell is shown. A positive voltage of 9 to 12 volts is applied to the control gate 1307. The source 203 and drain 205 of the ETOX cell are grounded. This results in electron injection toward the control gate 1307. Note that because of the curvature of the HSG silicon islands, the electric field is enhanced, aiding in the electron injection toward control gate.

It should be noted that the specific parameters of the ETOX cell may be optimized with respect to the different erase methods. The dielectric layer 1305 is the same as a conventional ETOX cell, i.e. oxide/nitride/oxide with approximately 120 to 180 angstrom equivalent thickness. If F-N erase through the channel is used, then the oxide underneath the HSG silicon islands needs to be as thin (approx. 80–100 angstroms) as tunnel oxide. The gate coupling ratio of the cell needs to be about 0.8 for proper operation.

If F-N erase through the control gate 1307 is used (by taking advantage of the field enhancement due to a larger HSG silicon island curvature), then the oxide underneath the HSG islands can be made thicker (e.g., approx. 120 to 160 angstroms) and the cell coupling ratio can be made smaller (e.g., approx. 0.5). In this case, the cell size can be smaller due to less capacitance needed between the control gate 1307 and the HSG silicon islands.

The 2-bit p-channel ETOX cell of the present invention presents many advantages. First, although the charge on individual HSG silicon islands may leak through adjacent local weak spots (defect) in the tunnel oxide, the overall effect on the total charge in the floating gate is negligible. Thus, the charge retention performance is significantly better than a conventional ETOX cell. Second, as a trade-off to charge retention, the tunnel oxide may be thinner for lower-voltage cell operation (program/erase) operations.

While the preferred embodiment of the invention has been illustrated and described, it will be appreciated that various changes can be made therein without departing from the spirit and scope of the invention.

The embodiments of the invention in which an exclusive property or privilege is claimed are defined as follows:

1. A method of simultaneously reading a 2-bit p-channel memory cell having a p+ drain, a p+ source, a control gate, and a floating gate formed from non-connecting hemispherical silicon grain (HSG) islands, said p+ drain and said p+ source being formed in an n-well, the method comprising:

applying a positive voltage to said control gate to generate a gate induced drain leakage (GIDL) current; and measuring a drain GIDL current at said drain and a source GIDL current at said source to determine the data stored in said memory cell.

2. The method of claim 1 further comprising applying a positive voltage to said n-well.

3. A method of simultaneously reading a 2-bit p-channel memory cell having a p+ drain, a p+ source, a control gate, and a floating gate formed from non-connecting hemispherical silicon grain (HSG) islands, said p+ drain and said p+ source being formed in an n-well, the method comprising:

applying a positive voltage to said control gate to generate a gate induced drain leakage (GIDL) current; and measuring a drain GIDL current at said drain and a source GIDL current at said source to determine the data stored in said memory cell, wherein it is determined that:

said memory cell holds a "00" data if said drain GIDL current and said source GIDL current is above a predetermined threshold;

said memory cell holds a "11" data if said drain GIDL current and said source GIDL current is below said predetermined threshold;

said memory cell holds a "10" data if said drain GIDL current is above said predetermined threshold and said source GIDL current is below said predetermined threshold; and said memory cell holds a "01" data if said source GIDL current is above said predetermined threshold and said drain GIDL current is below said predetermined threshold.

4. The method of claim 1 wherein said voltage to said control gate is a $V_{cc}$ voltage.

5. The method of claim 1 wherein said voltage to said n-well is a $V_{cc}$ voltage.

6. A method of simultaneously reading a 2-bit p-channel memory cell having a p+ drain, a p+ source, a control gate, and a floating gate formed from non-connecting hemispherical silicon grain (HSG) islands, said p+ drain and said p+ source being formed in an n-well, the method comprising:

applying a positive voltage to said control gate to generate a gate induced drain leakage (GIDL) current; and measuring a drain GIDL current at said drain and a source GIDL current at said source to determine the data stored in said memory cell, wherein said p+ drain and said p+ source are held to zero volts.

7. A method of simultaneously programming a 2-bit p-channel memory cell having a p+ drain, a p+ source, a control gate, and a floating gate formed from non-connecting hemispherical silicon grain (HSG) islands, said p+ drain and said p+ source being formed in an n-well, the method comprising:

applying a positive voltage to said control gate; and selectively applying a negative voltage to said p+ source or p+ drain to induce band-to-band tunneling induced hot electron (BBHE) injection into said floating gate.

8. The method of claim 7 further including biasing said n-well to a positive voltage.

9. The method of claim 7 wherein said positive voltage to said control gate is a $V_{cc}$ voltage.

10. The method of claim 7 wherein said negative voltage to said p+ source or p+ drain is $-V_{cc}$.

11. A method of simultaneously programming a 2-bit p-channel memory cell having a p+ drain, a p+ source, a control gate, and a floating gate formed from non-connecting hemispherical silicon grain (HSG) islands, said p+ drain and said p+ source being formed in an n-well, the method comprising:

applying a positive voltage to said control gate; and selectively applying a negative voltage to said p+ source or p+ drain to induce band-to-band tunneling induced hot electron (BBHE) injection into said floating gate, wherein if a digital "11" is to be stored in said memory cell, biasing both p+ source and p+ drain to said negative voltage;

if a digital "00" is to be stored in said memory cell, biasing both p+ source and p+ drain to a zero voltage;

if a digital "10" is to be stored in said memory cell, biasing said p+ source to said negative voltage and biasing said p+ drain to a zero voltage; and if a digital "01" is to be stored in said memory cell, biasing said p+ drain to said negative voltage and biasing said p+ source to a zero voltage.

12. A method of simultaneously programming a 2-bit p-channel memory cell having a p+ drain, a p+ source, a control gate, and a floating gate formed from non-connecting hemispherical silicon grain (HSG) islands, said p+ drain and said p+ source being formed in an n-well, the method comprising:

applying a positive voltage to said control gate; and selectively applying a negative voltage to said p+ source or p+ drain to induce band-to-band tunneling induced hot electron (BBHE) injection into said floating gate, wherein if a digital "11" is to be stored in said memory cell, biasing both p+ source and p+ drain to a zero voltage;

if a digital "00" is to be stored in said memory cell, biasing both p+ source and p+ drain to said negative voltage;

if a digital "10" is to be stored in said memory cell, biasing said p+ drain to said negative voltage and biasing said p+ source to a zero voltage; and if a digital "01" is to be stored in said memory cell, biasing said p+ source to said negative voltage and biasing said p+ drain to a zero voltage.

* * * * *